(12) United States Patent
Mathieu et al.

(10) Patent No.: US 7,479,792 B2
(45) Date of Patent: Jan. 20, 2009

(54) METHODS FOR MAKING PLATED THROUGH HOLES USABLE AS INTERCONNECTION WIRE OR PROBE ATTACHMENTS

(75) Inventors: Gaetan L. Mathieu, Varennes (CA); Igor Y. Khandros, Orinda, CA (US); Carl V. Reynolds, Pleasanton, CA (US)

(73) Assignee: FormFactor, Inc., Livermore, CA (US)

( * ) Notice: Subject to any disclaimer, the term of this patent is extended or adjusted under 35 U.S.C. 154(b) by 214 days.

(21) Appl. No.: 11/403,138

(22) Filed: Apr. 11, 2006

(65) Prior Publication Data
US 2006/0185164 A1    Aug. 24, 2006

Related U.S. Application Data

(62) Division of application No. 10/723,269, filed on Nov. 26, 2003, now Pat. No. 7,024,763.

(51) Int. Cl.
*G01R 31/02* (2006.01)
(52) U.S. Cl. .................................................. 324/754
(58) Field of Classification Search ........................ None
See application file for complete search history.

(56) References Cited

U.S. PATENT DOCUMENTS

| | | | |
|---|---|---|---|
| 3,378,622 A | 4/1968 | Marin | |
| 3,384,955 A | 5/1968 | Pierce | |
| 4,024,629 A | 5/1977 | Lemonie et al. | |
| 5,046,242 A | 9/1991 | Kusma | |
| 5,148,265 A | 9/1992 | Khandros et al. | |
| 5,476,211 A | 12/1995 | Khandros | 228/180.5 |
| 5,656,798 A | 8/1997 | Kubo et al. | |
| 5,657,537 A | 8/1997 | Saia et al. | |
| 5,772,451 A | 6/1998 | Dozier, II et al. | |

(Continued)

OTHER PUBLICATIONS

U.S. Appl. No. 10/202,712, filed Jul. 7, 2002.

*Primary Examiner*—Jermele M Hollington
(74) *Attorney, Agent, or Firm*—N. Kenneth Burraston

(57) ABSTRACT

Methods are provided for making plated through holes usable for inserting and attaching connector probes. In a first method, a curved plated through hole is formed by bonding curved etchable wires to a first substrate, plating the wires with a non-etchable conductive material, encasing the plated wires with a dielectric material to form a second substrate, planing the second substrate to expose the etchable wire, and etching the wires to leave plated through holes. In a second method, wires coated with a first etchable layer are initially bonded to a substrate, a second non-etchable plating layer is then applied over the first layer, and the first layer is etched away leaving plated through holes with wires disposed inside. In a third embodiment, a layer of masking material is initially deposited on a substrate and etched to form holes which are filled with a sacrificial fill material, the masking material is then removed, the fill material plated, grinding is performed to remove some plating to expose the fill material, and the fill material is then etched away leaving plated attachment wells. Probes may be attached to the plated through holes or attachment wells to create resilient spring contacts to form a wafer probe card assembly. A twisted tube plated through hole structure is formed by supporting twisted sacrificial wires coated with the plating material in a substrate, and later etching away the wires.

11 Claims, 6 Drawing Sheets

U.S. PATENT DOCUMENTS

| | | | |
|---|---|---|---|
| 5,806,181 A | 9/1998 | Khandros | 29/874 |
| 5,917,707 A | 6/1999 | Khandros et al. | |
| 5,974,662 A | 11/1999 | Eldridge | 29/842 |
| 5,994,152 A | 11/1999 | Khandros | 436/617 |
| 6,010,962 A | 1/2000 | Liu et al. | |
| 6,029,344 A | 2/2000 | Khandros et al. | |
| 6,033,935 A | 3/2000 | Dozier et al. | |
| 6,064,213 A | 5/2000 | Khandros et al. | |
| 6,110,823 A | 8/2000 | Eldridge et al. | |
| 6,184,053 B1 | 2/2001 | Eldridge | 438/52 |
| 6,255,126 B1 | 7/2001 | Mathieu | 438/15 |
| 6,336,269 B1 | 1/2002 | Eldridge et al. | |
| 6,458,696 B1 | 10/2002 | Gross | 438/668 |
| 6,521,842 B2 | 2/2003 | Brinthaupt | |
| 6,538,214 B2 | 3/2003 | Khandros | |
| 6,615,485 B2 * | 9/2003 | Eldridge et al. | 324/756 |
| 6,914,468 B2 | 7/2005 | Van Dijk et al. | |
| 6,972,578 B2 | 12/2005 | Martens et al. | |
| 7,024,763 B2 | 4/2006 | Mathieu et al. | |
| 7,047,638 B2 | 5/2006 | Eldridge et al. | |
| 2001/0044225 A1 | 11/2001 | Eldridge et al. | |
| 2002/0004320 A1 | 1/2002 | Pedersen | |
| 2005/0108875 A1 | 5/2005 | Mathieu et al. | |
| 2007/0296433 A1 * | 12/2007 | Gritters | 324/757 |
| 2007/0296435 A1 * | 12/2007 | Eldridge et al. | 324/761 |

* cited by examiner

METHODS FOR MAKING PLATED THROUGH HOLES USABLE AS INTERCONNECTION WIRE OR PROBE ATTACHMENTS

CROSS-REFERENCE TO RELATED APPLICATION

This application is a divisional application of U.S. application Ser. No. 10/723,269, filed on Nov. 26, 2003, now U.S. Pat. No. 7,024,763.

BACKGROUND

1. Technical Field

The present invention relates to methods for making plated through holes. More particularly, the present invention relates to methods for making plated through holes usable to attach and support interconnection wires or probes.

2. Related Art

Plated through holes have been developed to connect electrical components on different layers of multiple layer semiconductor structures, such as layers of a printed circuit board (PCB). Plated through holes are further used to form interconnect elements enabling one PCB to be connected to components on a separate PCB or other discrete electrical components.

With a single multilayered PCB, the plated through holes formed in the PCB during manufacture serve to provide electrical coupling between circuits on the different layers. Fabrication of a PCB typically includes drilling a hole through a substrate made up of the layers, electrolytically plating the hole and conductive areas on the PCB layers with a metallic substance such as copper to form the plated through hole. A first circuit pattern is then formed in the conductive area on a first PCB layer and a second circuit pattern on a second PCB layer such that the plated through hole electrically couples the first circuit pattern to the second circuit pattern.

Plated through holes were developed for layered PCBs because it was generally found impractical due to the labor and cost involved to form multiple connections by physically inserting a conductive element (such as a wire) in a hole and then connecting the element to two circuits by soldering or other means. As described above, the usual method of forming plated through holes is to plate the circuits formed on the PCB layers and the through hole connections simultaneously so that the through hole connection is made as an integral part of circuit elements on different levels of the PCB without significant added labor or cost.

For two separate PCBs having electrical components to be connected after manufacture, or one PCB to be connected to a separate discrete electrical component, an insertable conductive element (such as a wire) forming a connector is still typically used. Such connectors can be formed by inserting connector pins into plated through holes of separate PCBs and soldering them in place. Such plated through holes provide connections between the pins and conductive regions on the separate PCBs or discrete components. An example of a technique of manufacturing PCBs with connector pins provided in plated through holes is described in U.S. Pat. No. 6,521,842, entitled "Hybrid Surface Mount And Pin Thru Hole Circuit Board."

Recently PCBs have been used to support multiple resilient wires or probes to form probe cards used in temporarily connecting to electrical components, such as on semiconductor wafers for testing. It would be desirable to provide a method for efficiently manufacturing such multiple temporary connection elements for probe cards.

SUMMARY

In accordance with the present invention, methods are provided for making plated through holes, or plated attachment wells to provide manufacturing flexibility. Methods are further described to enable the plated through holes or plated attachment wells to support wires which may be used to form electrical connectors or test probes.

In a first embodiment, a method is provided for making plated through holes, which may be curved. Initially wires made of an etchable or dissolvable material are bonded to a sacrificial substrate. The wires are curved if curved plated through holes are desired. The wires are then plated with a durable conductive material that does not dissolve under the same conditions as the wire material. The plated wires are then encased in a dielectric material, such as epoxy or ceramic, to form a substrate containing the coated wires, leaving a portion of the wires exposed extending beyond the dielectric material layer. The substrate is then planed to expose the wire material inside the plating. The wire material is then etched or dissolved leaving plated through holes.

Plated through holes formed by the first embodiment can be used as interconnect elements by inserting a rod into one end of the plated through holes, while forming solder bumps on the other ends. Alternatively, interconnect wires can be inserted through curved plated through holes, with the curved portion of the plated through holes providing friction to prevent the interconnect wires from falling out. As another alternative, the probe wires can be inserted through the plated through holes and soldered in to assure they cannot be easily removed, particularly if the plated through holes are not curved.

In a second embodiment, a method is provided for making plated through holes extending from a substrate, wherein a thin fiber wire is provided within each plated through hole. Initially in the second embodiment, wires coated with a layer of dissolvable material are bonded to a sacrificial substrate. A plating layer is applied over the dissolvable material. Next the plating is partially ground down or polished to expose a portion of the dissolvable material coating the wires. The dissolvable material is then etched away or dissolved leaving plated through holes formed by the plating material extending above a substrate with wires disposed inside.

In a third embodiment, a method is provided for forming plated attachment wells for supporting connector wires or rods using photolithography techniques. For this method a layer of masking material is initially deposited on a substrate and etched to form holes, which are filled with a sacrificial fill material. The masking material is then removed, and the sacrificial fill material plated with a conductive material. Grinding is performed to remove some plating to a desired height above the substrate exposing the sacrificial fill material. The sacrificial fill material is then etched away leaving plated attachment wells. Wires or rods may then be inserted into the plated attachment wells and soldered in place.

The plated through holes formed, as described above, may be used to interconnect layers of a single PCB. Resilient interconnect wires can be rigidly provided in the plated through holes by solder or epoxy, or configured to be pluggable or unpluggable making spring contact with a plated through hole or attachment well without requiring solder or epoxy for support. The interconnect wires or probes can further be rigidly connected to electrical components on other substrate layers (by solder or other means), or temporarily connectable resilient spring contacts (essentially forming test probe cards). As one example, the resilient interconnect probes provided in the plated through holes can be the probes described in U.S. Pat. No. 5,994,152.

In a further embodiment plated twisted tube springs forming twisted plated through holes are encased in a dielectric substrate to form an interconnect layer. Initially to form the substrate with twisted tube springs, wires made of a dissolvable material are twisted to a desired pitch, plated with an electrically conductive alloy and inserted into holes of a set of brass stencils. A dielectric substrate material is then formed around the twisted wires with a portion of the wires extending beyond the dielectric, and the dissolvable wire material and brass stencils are etched away leaving only the electrically conductive tubes encased in a dielectric substrate.

BRIEF DESCRIPTION OF THE DRAWINGS

Further details of the present invention are explained with the help of the attached drawings in which.

DETAILED DESCRIPTION

FIGS. 1A-1D show cross sectional views illustrating steps of a first method of making a substrate with plated through holes, where the plated through holes may be curved. In a first step shown in FIG. 1A, wires 2 are bonded to a first sacrificial substrate 4. The wires 2 may be bonded using standard wire bonding techniques, such as soldering or thermosonic bonding. The wires 2 are preferably made of a material that is readily etched or dissolved (e.g., copper, gold, aluminum). The wires are curved if curved plated through holes are desired, or straight if straight plated through holes are desired.

The first sacrificial substrate 4 can be formed using any number of desirable substrate materials. Examples of suitable substrate materials include silicon, ceramic, Iron/Nickel alloys (e.g., "alloy 42," "Kovar," "CuInvarCU"), etc. To facilitate eventual release of the structures to be formed on the first sacrificial substrate 4, its surface can be coated with a release layer, which may be a material that is readily etched away. Suitable release materials include copper, gold, aluminum and titanium-tungsten, but are not limited by these examples. The surface of the first sacrificial substrate 4 may also be coated with a material that facilitates bonding the wires 2 to its surface. Such materials include, for example, gold, palladium or silver. The coating which serves to facilitate bonding can likewise serve to form a redistribution layer, similar to copper on a printed circuit board (PCB). With a redistribution layer exposed after the sacrificial substrate 4 has been etched away, components can be attached to the coating or solder bumps can be placed in a fixed pattern. This gives the possibility of a second redistribution layer including: 1) where coated wires or probes are attached to the coating to connect to the second layer, and 2) where traces are deposited to connect to a second layer.

Figure 1A:
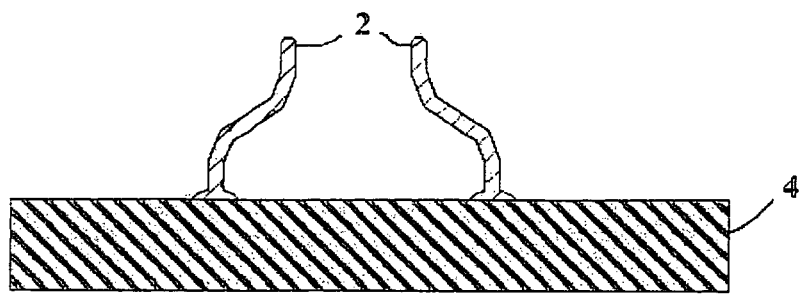
FIGS. 1A-1D show cross-sectional views of a substrate illustrating processing steps of a first method of manufacturing plated through holes.
Figure 1B:
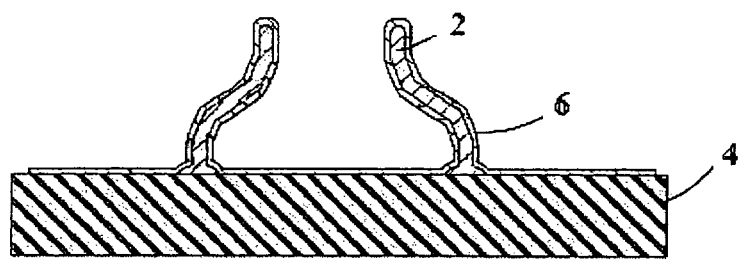

As shown in FIG. 1B, the wires 2 are coated with a durable plating material 6 such as rhodium or palladium. Traces can be used as a mask to etch the wire-coating layer to connect to other components. Any deposition method may be used, including electroplate, chemical vapor deposition, sputter deposition, electrolysis plating, electron beam deposition, or thermal evaporation. If electroplating is used, it may be desirable first to short the wires 2 together. This may be done in a variety of ways including (1) applying a layer of conductive material (a shorting layer) to the surface of the first sacrificial substrate, if the sacrificial substrate is not conductive in the first place, and then bonding the wires to the shorting layer, or (2) providing connections from each wire through the first sacrificial substrate (e.g., through vias in the substrate) to a shorting layer applied to the back side of the first sacrificial substrate 6. If the second of these two methods is used, the plating material 6 will form only on the wires 2 but not on the surface of the first sacrificial substrate 4.

The plating 6 shown in FIG. 1B assumes that a shorting layer was applied to both the surface of the first sacrificial substrate and the wires bonded to the shorting layer. The plating thus forms on the wires and over the entire surface of the first sacrificial substrate. As an alternative, masking material can be placed over selected areas of the shorting layer, preventing the plating from forming where the masking material is placed. The masking material can be used to pattern traces, which are formed in combination with the plated wires to connect the wires 2 to additional redistribution layers as described previously.

As will be seen, the wires 2 will be etched away, leaving a tube formed of the plating material 6. Alternatively, the wires can be pulled out in a separate operation after the coating is removed. To increase the inner diameter of this tube, one or more intermediate etchable layers, may be formed on the wire prior to application of the final plating material that will form the tube. The intermediate etchable layers will then be etched away with the wires 2. Alternatively, thicker wires can be used.

Figure 1C:
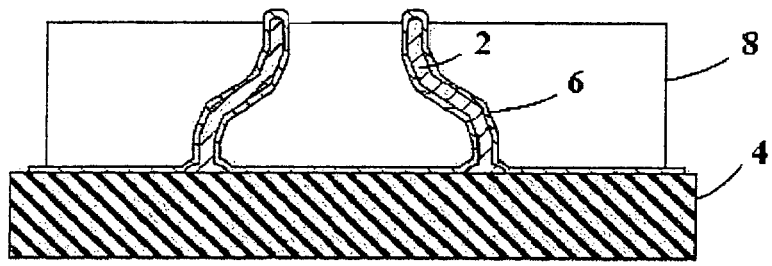

As shown in FIG. 1C, the plated wires are then encased in a final dielectric substrate material 8. Examples of material usable for the substrate 8 include (1) an epoxy that sets into a relatively hard, durable form, (2) a ceramic material like LTCC and HTCC, or (3) a glass material, etc. The dielectric can have its surface metalized by applying a coating using a known technique such as Chemical Vapor Deposition (CVD). The entire substrate can be electroplated with for example with nickel or a nickel alloy. The bulk substrate can then be grounded and used for impedance control.

Figure 1D:
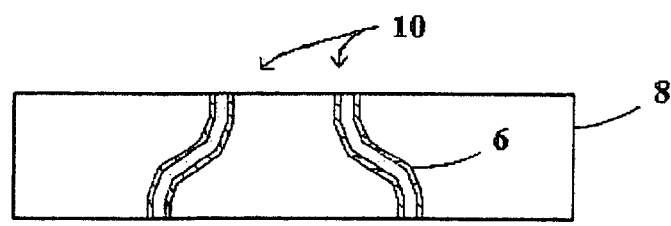

Next, as shown in FIG. 1D, the first sacrificial substrate 4 is removed, and the top and bottom of the resulting structure are planarized, such as by polishing, lapping, grinding etc. Etching is then performed to remove the wires 2 leaving the plated material to form plated through holes 10. Planarizing the top is done enough to remove a portion of the plating 6 to expose the etchable wire material 2, so that the wire material 2 can be etched away. Planarizing the bottom can be done to remove the portion of the plating material 6 originally on the surface of substrate 4. Alternatively, rather than planarize the entire bottom surface, selected portions of the plating 6 on the bottom surface of the substrate 4 may be etched so that the through holes are not shorted together. Of course, if a masking material was applied to the structure shown in FIG. 1A between the wires 2 prior to plating, then the plating 6 shown in FIG. 1B would not have formed where the masking material was disposed, and the wires (and resulting through holes shown in FIG. 1D) would not be shorted together.

Figure 2:
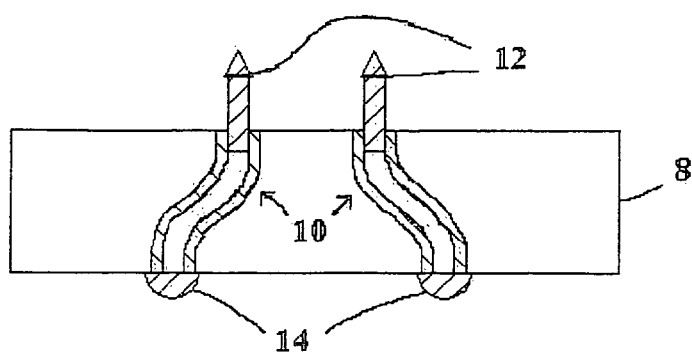
FIG. 2 illustrates interconnect elements which may be attached to the plated through holes made using the process shown in FIGS. 1A-1D to form a space transformer for a probe assembly.

FIG. 2 shows a cross sectional view of the substrate 8 with plated through holes 10 formed by the process of FIGS. 1A-1D, illustrating examples of how interconnect elements, such as rods or probes, can be attached. As shown in FIG. 2, ends of interconnect elements in the form of electrically conductive rods or probes 12 are inserted in and secured (e.g., by soldering) to the plated through holes 10. Such insertable interconnect elements 12 may be rigidly attached to another device, such as by soldering, to form a connector. The interconnect elements 12 can also be resilient elements such as needle probes, cobra probes, or spring probes used to make components of a probe card assembly for probing electronic devices, such as on semiconductor wafers.

Non-limiting examples of spring probes which may be used for the interconnect element 12 are shown in U.S. Pat. Nos. 5,994,152 and 6,255,126, U.S. Published Application No. US2001/0044225 A1, and pending U.S. patent application Ser. No. 10/202,712, filed Jul. 24, 2002, all of which are incorporated herein by reference. Although the spring probes shown in some of these illustrative examples, such as U.S. Pat. No. 6,255,126, are not cylindrical to permit insertion into the cylindrical openings in the plated through holes 10 shown in FIG. 2, plated through holes with other shapes could be formed as would be understood by a person of skill in the art. For example, the cylindrical wires 2 used in the steps of FIGS. 1A-1E can be replaced by square rods to enable the resulting plated through holes formed to match the square spring elements described in U.S. Pat. 6,255,126. Likewise wires with other geometrical shapes can be used to create plated through holes of a similar shape depending upon the shape of the interconnect element used.

Additional interconnect elements 14 may also be formed on the other side of the substrate. In the example shown in FIG. 2, the interconnect elements 14 are solder balls deposited over the plated through holes 10. Rod or probe interconnect elements 12 may be likewise inserted in place of the solder balls 14 to provide resilient contacts on both surfaces of substrate 8.

With resilient probes 12 attached to one side of the substrate 8 and solder balls 14 on the other (as shown in FIG. 2), a space transformer is formed which can be used in a probe card assembly to directly connect to a semiconductor wafer or other device under test. The structure of FIG. 2 can, thus, replace the space transformer 506 in FIG. 5 of U.S. Pat. No. 5,974,662, which is incorporated herein by reference. With resilient probes contacts attached to both sides of a substrate (not shown in FIG. 2), an interposer, such as the interposer 504 of a probe card assembly shown in FIG. 5 of U.S. Pat. No. 5,974,662, can be formed. One or more structures like the one shown in FIG. 2 may be secured to a larger substrate to build up a large array of probes, such as the tile 600 attached to a space transformer 622 in FIG. 6A of U.S. Pat. No. 5,806,181, incorporated herein by reference.

Figure 3A:
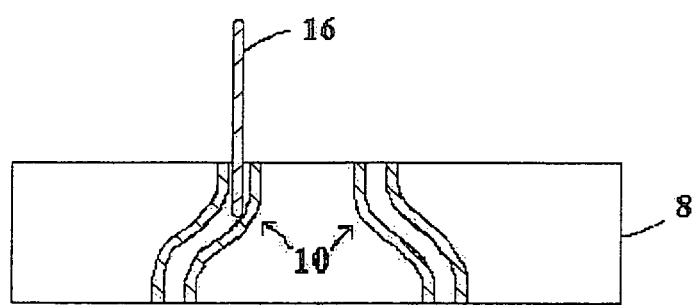
FIGS. 3A-3C show how an interconnect element is formed by a thin wire inserted into the plated through holes made using the process shown by FIGS. 1A-1D.
Figure 3B:
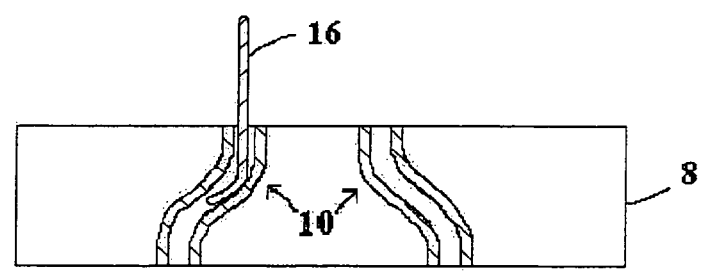
Figure 3C:
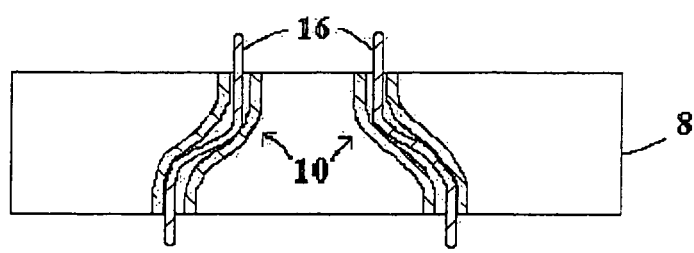

FIGS. 3A-3C illustrate an additional interconnect element configuration which may be used with the substrate 8 having plated through holes 10 formed by the process shown in FIGS. 1A-1D. FIGS. 3A-3C show how thin wires 16 are inserted into the plated through holes 10 of substrate 8. In FIG. 3A, the thin wire 16 is inserted into one of the plated through holes 10 only to a point where the plated through hole curves. The wire can be attached using solder similar to the rods or probes of FIG. 2. With curved plated though holes, the thin wire 16 can be inserted farther into the curved plated through hole 10, as shown in FIG. 3B, so soldering may not be required because friction with the walls of the through holes 10 may be sufficient to hold the thin wire 16 in place. If it is desirable to have thin wire probes extending from both sides of a substrate, the thin wire 16 can be extended farther through the plated through hole 10, as shown in FIG. 3C. Again, if the plated through hole is curved, friction will hold the thin wire, so soldering may not be required.

The wires 16 may form buckling beam (or "cobra") type probes, with the substrate being a probe head, space transformer, or tile for a probe card. For buckling beam probes, the wires 16 are made of a resilient material so that they bend when contact is made with another electrical element, and then straighten out, or return to their original shape when disconnected. Because the plated through holes 10 provide added current carrying capacity, the wires 16 may be thinner than prior buckling beam probes. For example, such wires may have diameters less than 0.003 inches and in some embodiments 0.002 inches, 0.001 inches, or even smaller, while prior buckling beam probes required diameters of at least 0.003 inches.

Figure 4A:
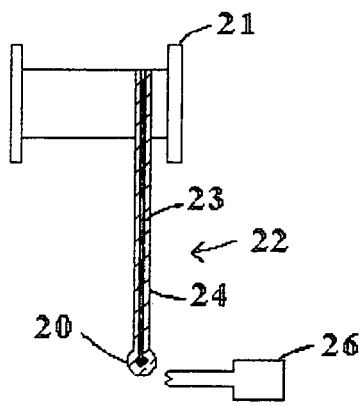
FIGS. 4A-4D show cross-sectional views of a substrate illustrating processing steps of a second method of manufacturing plated through holes with a thin wire inside.
Figure 4B:
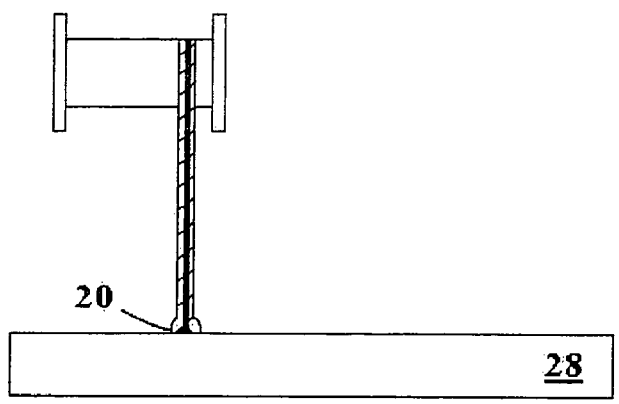

FIGS. 4A-4D illustrate a method of making a plated through hole with a thin fiber inside. As shown in FIG. 4A, a ball 20 is formed at the end of a wire 22 on a spool 21. The wire 22 comprises a thin fiber 23 (e.g., graphite) coated with a readily etched material layer 24 (e.g., copper, gold, aluminum). An electro-flame off tool 26, for example, may be used to cut the wire 22 to create the ball 20. As shown in FIG. 4B, the ball 20 is then bonded to a substrate 28 using standard wire bonding techniques. Alternatively, the wires may be simply cut or sheared without forming a ball, and the wired bonded directly to the substrate 28.

Figure 4C:
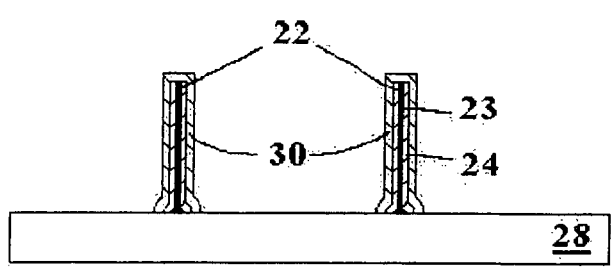
Figure 4D:
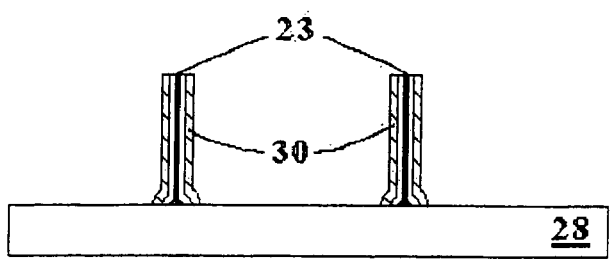

Wires 22 attached to the substrate 28 are next plated with a durable plating material 30 such as rhodium or palladium, as shown in FIG. 4C. Grinding or polishing is then performed to remove a portion of the plating material 30 to expose a portion of the etchable material coating layer 24. The etchable material layer 24 on the fiber 23 is then etched away, leaving the fiber 23 in a plated through hole tube formed by the durable plating material 30, as shown in FIG. 4D. All of the etchable material coating 24 may be etched away, as shown in FIG. 4D, leaving the fiber 23 loose in the tube of plating material 30. Alternatively, a portion of the coating near the bottom of the tube of plating material 30 may be left in place to better secure the fiber 23 inside the tube 30.

The tube of plating material 30 can be bent or curved, causing an end of the wire 23 to "pop" out of the end of the tube 30. The wire may be then more readily attached to form a coaxial type connector with an air core. Alternatively, the fiber 23 can have multiple coatings, only one of which will be readily etchable, so that after etching a wire will be provided within multiple tubes.

As an alternative to using a wire 22 made up of a thin fiber 23 coated with a readily etchable material layer 24, as described with respect to FIGS. 4A-4D, the wires 22 used in the process can be made entirely of an etchable material. As such, all of the wires 22 will be entirely etched away in the process leaving only plated through hole tubes 30 standing on a substrate 28.

Figure 5A:
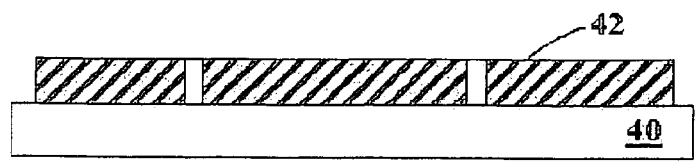
FIGS. 5A-5E show cross-sectional views of a substrate illustrating processing steps of a third method of manufacturing plated attachment wells.
Figure 5B:
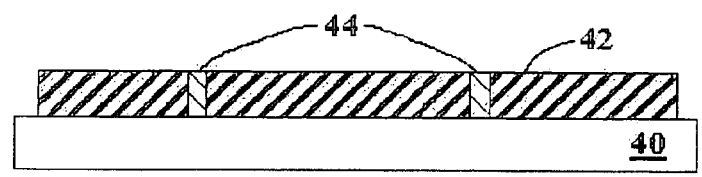
Figure 5C:
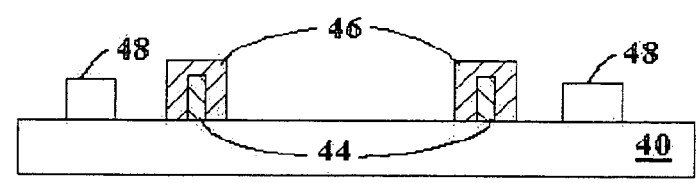
Figure 5D:
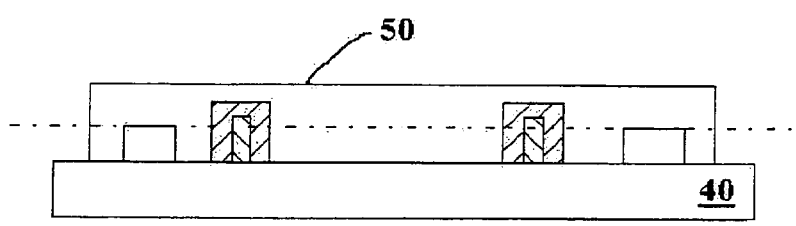
Figure 5E:
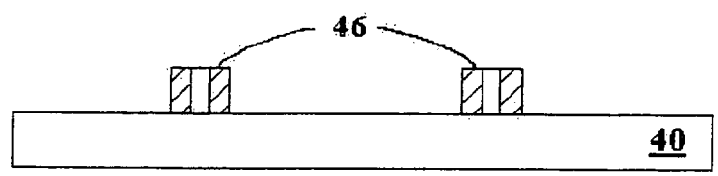

FIGS. 5A-5E illustrate a method of making a plated attachment well. As shown in FIG. 5A, a substrate 40 is coated with a masking material 42 having openings. The openings are filled with a sacrificial fill material 44, as shown in FIG. 5B. The substrate 40 may form the surface of an electronic component, e.g. a space transformer, probe head, or tile for a probe card. As shown in FIG. 5C, the masking material 42 is next removed, and the sacrificial fill material 44 is plated with a durable plating material 46. Grinding stops 48 may optionally be attached to the substrate 40. As shown in FIG. 5D, a casting material 50 is applied. The casting material 50 is then ground (or polished or lapped or otherwise ground down) to the grinding stops 48 (if attached), as illustrated by the dashed line in FIG. 5D. After grinding the casting material 50, the grinding stops 48 are removed and the sacrificial fill material 44 is etched away, leaving the plating material forming attachment wells, as shown in FIG. 5E.

Rather than use grinding stops 48, a grinding machine may simply be configured to grind to a specified height above the electronic component surface or to grind a specified distance into the casting material. The grinding stops 48 may be any material that can be sensed by the grinding machine, and the casting material 50 can be any material that will support the plated sacrificial fill material during grinding and then can be readily removed (e.g., hard waxes, polymers, etc.).

Figure 6:
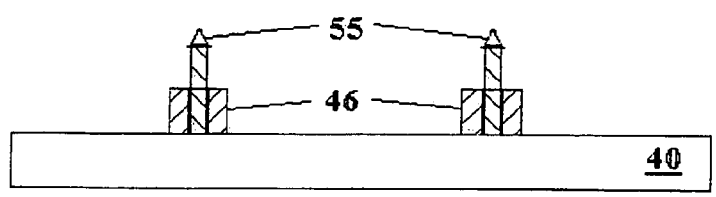
FIGS. 6-7 illustrate attachment of interconnect probes in the plated attachment wells made using the process shown in FIGS. 5A-5E.
Figure 7:
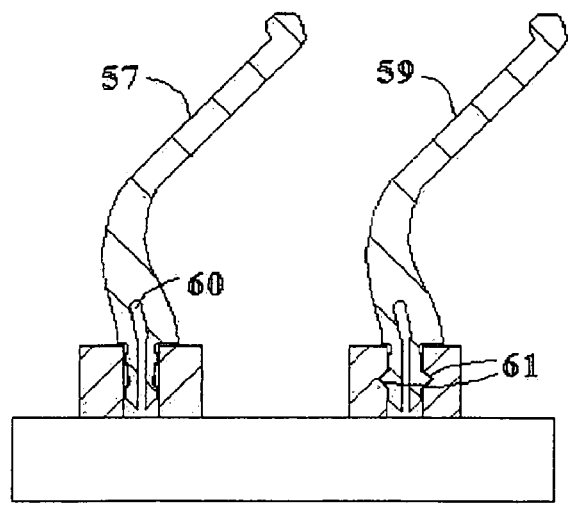

FIGS. 6-7 illustrate exemplary uses of the substrate with attachment wells formed using the method described with respect to FIGS. 5A-5E. In FIG. 6, rods or probes 55 are inserted and attached, e.g., by soldering to the attachment wells 46. FIG. 7 shows above surface wire type spring probes 57 and 59, which can be inserted in the attachment wells. The spring probe 57 has a slot 60 forming a compressible contacting surface when inserted within the well to securely hold the probe 57 within the well. Even with the compression slot 60, soldering can be used to assure the probe 57 remains engaged within the well. Probe 59 shows modification to the probe 57 to add laterally protruding bumps 61 as an alternative to assure the probe remains engaged within the well. Other alternative wire-type probes may be formed by bonding wires inside the wells. For example, the wire shown in FIGS. 7A-7C of U.S. Pat. No. 5,467,211 can be bonded inside the well. Optionally, the wire can be coated as shown in FIG. 8 of U.S. Pat. No. 5,467,211, incorporated herein by reference. When any of the wire-type probes are inserted, the well can be filled with solder to increase the strength of its attachment if desired.

The sacrificial fill material used to form the attachment wells in FIGS. 5A-5E can have a shape other than cylindrical. The fill material can be square, rectangular, etc. As a further alternative illustrated by the drawing in FIG. 8A, stacked structures of sacrificial fill material 62 can be formed by depositing and masking multiple layers 64 and 66. The structure of FIG. 8A includes the rectangular layers 64 and 66, the smaller 64 being stacked on top the larger 66.

Figure 8A:
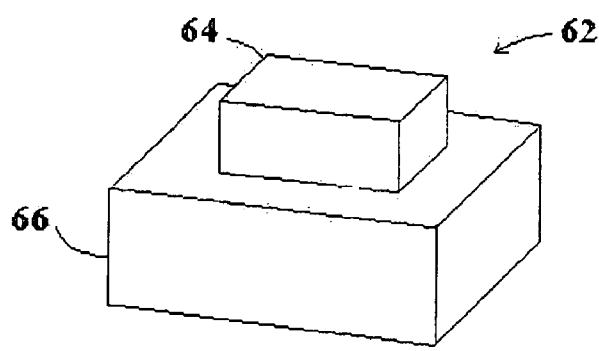
FIGS. 8A-8B show an alternative configuration for manufacturing a plated attachment well to support a probe without the need for soldering.
Figure 8B:
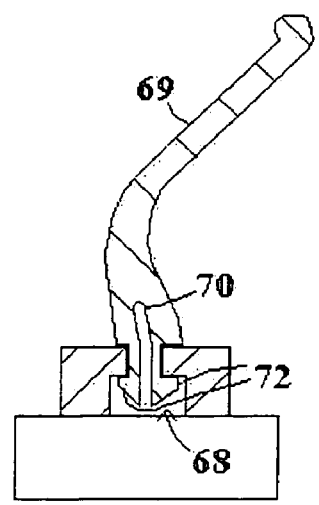

The sacrificial fill structure 62 of FIG. 8A is used to form an attachment well 68 as shown in FIG. 8B, allowing a surface spring 69 to be attached without the need for soldering. The spring probe 69 includes a compressible slot 70 and lateral extension bumps 72. The extension bumps 72 extend into the large rectangular area, and engage the smaller rectangular area to prevent the spring probe 69 from being easily removed after insertion in the attachment well 68.

Probes or wires can be inserted into the attachment wells or plated through holes either one at a time, or together in a group fashion. For example, although only a single probe 69 is shown in FIG. 8, multiple spring probes such as probe 69 can be held in a fixture which aligns the probes for insertion into separate attachment wells, enabling the group of probes to be inserted into attachment wells concurrently. Even without snapping the probes into attachment wells as in FIG. 8, a fixture can hold groups of probes or wires in wells or holes while solder or epoxy is applied to secure the probes or wires concurrently. With support provided by the attachment wells or holes, groups of probes can potentially be transferred into the attachment wells or holes concurrently without requiring a holding fixture for the probes. Probes or wires can be installed in single or group fashion into the attachment wells or holes described herein, including the attachment wells formed as shown in FIGS. 5A-5E, or the plated through holes formed as shown in FIGS. 1A-1D. Wires or probes installed in a single or group fashion can include probes 12 of FIG. 2, wire 16 of FIGS. 3A-3C, probes 55 of FIG. 6, probes 57 and 59 of FIG. 7, or probe 69 of FIG. 8B.

FIGS. 9A-9E show cross-sectional views illustrating processing steps for manufacturing encased twisted tube springs that can be used as a layer for electrically interconnecting two other substrate layers. In a first step shown in FIG. 9A, copper wires 74 with a square or rectangular cross section are twisted to a specific twist pitch. The copper wires are then plated using a hard and highly electrically conductive alloy such as rhodium. The coated wires are then cut to length.

Figure 9A:
FIGS. 9A-9E show cross-sectional views illustrating processing steps for manufacturing encased twisted tube springs that can be used as a layer for electrically interconnecting two other substrate layers.
Figure 9B:
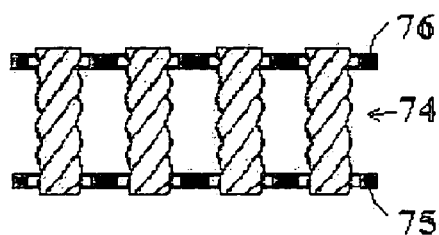
Figure 9C:
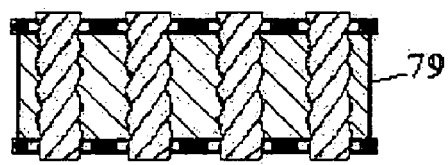

As shown in FIG. 9B, a set of brass stencils 75-76 are used to align the twisted wire rods 74. The base or bottom stencil 75 can be used as a key for the start of the twists if the wires are not separately twisted before insertion into the stencils 75 and 76. A portion of the twisted rods 74 extend outside each stencil. After the twisted rods are inserted in the stencils 75-76, the gap between the brass stencils is filled with epoxy 79 by molding a solid epoxy, or injecting the epoxy in liquid form around the twisted wires, as shown in FIG. 9C.

Figure 9D:
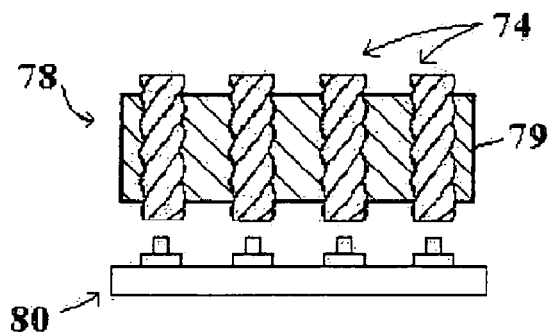
Figure 9E:
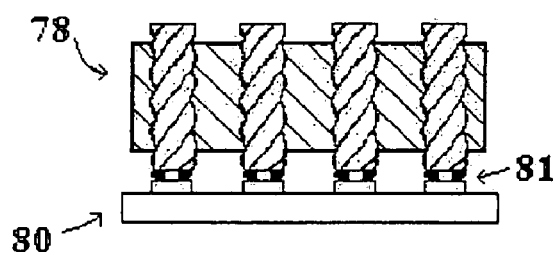

As illustrated in FIG. 9D, the copper wire material and brass stencils 75 and 76 are next dissolved leaving the hollow rhodium twisted tubes encased in epoxy. The rhodium tube springs and epoxy layer now forms a layer 78 which can be used to interconnect other layers. With the tubes aligned in a pattern by the brass stencils, the tubes of layer 78 can be aligned to match probe locations on another substrate, as illustrated in FIG. 9D. FIG. 9E further shows the layer 78 with twisted tubes connected to mate with probes provided in attachment wells on a separate layer 80 having attachment wells with probes as shown in FIG. 6. As shown in FIG. 9E, to connect the layers 78 and 80, the probes on the layer 80 are inserted into the twisted tubes and can be attached using solder joints 81.

The ability to rework a tile layer which supports spring probes (reworking meaning to remove the tile and replace it with another tile) is very difficult to accomplish if soldering or epoxy connects the tile layer and an interconnecting space transformer layer to make permanent contacts between the layers. Probes are typically formed and attached by solder or epoxy to ceramic substrates to form tiles. The tiles are then attached to another multiplayer ceramic substrate space transformer using a thin film copper polyamide epoxy layer.

Reworking to remove a tile from a space transformer is further made difficult if an underfill material (such as a teflon or silicon gel) is used as a seal to fill gaps between a connected tile and space transformer. The under fill material is used to absorb stress and prevent cracking of the connecting thin film epoxy layer which can be under stress since during fabrication the rate of thermal expansion of the ceramic and epoxy layers is quite different. The difference in the coefficient of thermal expansion between the tile supporting the probes and the multiplayer space transformer can cause a significant misalignment. The curved plated through holes shown fabricated in FIGS. 1A-1D can help alleviate the misalignment problem, along with the underfill material. With different expansion rates between tile and space transformer layers, the process of permanently joining the tile layer to the space transformer layer is challenging and typically requires expensive x-ray procedures to inspect.

The difficulty with removing permanently connected tiles and space transformer layers is similar to the difficulty in disconnecting individual spring probes from tiles, since the spring probes must typically be directly attached with solder or an epoxy film to assure the probes remain robust. One solution to making the probes more easily removable is to use the spring contact probe and attachment well combination shown in FIG. 8B.

Although the present invention has been described above with particularity, this was merely to teach one of ordinary skill in the art how to make and use the invention. Many additional modifications will fall within the scope of the invention, as that scope is defined by the following claims.

What is claimed is:

1. A probing apparatus, comprising:
   a substrate;
   a plurality of attachment wells extending from a surface of the substrate, each attachment well having an opening that extends into the well to the surface of the substrate and adapted to receive a resilient probe; and
   a plurality of resilient probes, wherein each probe is inserted into the opening of a respective attachment well.

2. The apparatus of claim 1, wherein the attachment wells are conductive.

3. The apparatus of claim 1, wherein the resilient probes are soldered in the attachment wells.

4. The apparatus of claim 1, wherein an engaging portion of each probe is inserted into the opening of a respective attachment cell, the engaging portion comprising a slot whereby the engaging portion is compressible.

5. The apparatus of claim 4, wherein the engaging portion of each probe further comprises laterally protruding bumps configured to engage inside, side walls of a respective attachment well.

6. The apparatus of claim 1, wherein the opening comprises a cavity within the attachment well and a passage to the cavity through an end of the attachment well opposite the surface, wherein a width of the passage is smaller than a width of the cavity.

7. The apparatus of claim 1, wherein a contact portion of each probe extends out of a respective attachment well.

8. A probing apparatus, comprising:
   a substrate;
   a plurality of attachment wells on the substrate, a portion of which being adapted to receive resilient probes; and
   a plurality of resilient probes, each inserted into a respective conductive attachment well, wherein the attachment wells are formed lithographically on the substrate.

9. A probing apparatus, comprising:
   a substrate;
   a plurality of attachment wells on the substrate, a portion of which being adapted to receive resilient probes; and
   a plurality of resilient probes, each inserted into a respective conductive attachment well, wherein the attachment wells comprise a first opening and a second opening of a different size.

10. The apparatus of claim 9, wherein the second opening is larger than the first opening.

11. The apparatus of claim 10, wherein the second opening is adapted to receive an engaging portion of the respective resilient probe.

* * * * *